Figure 1:
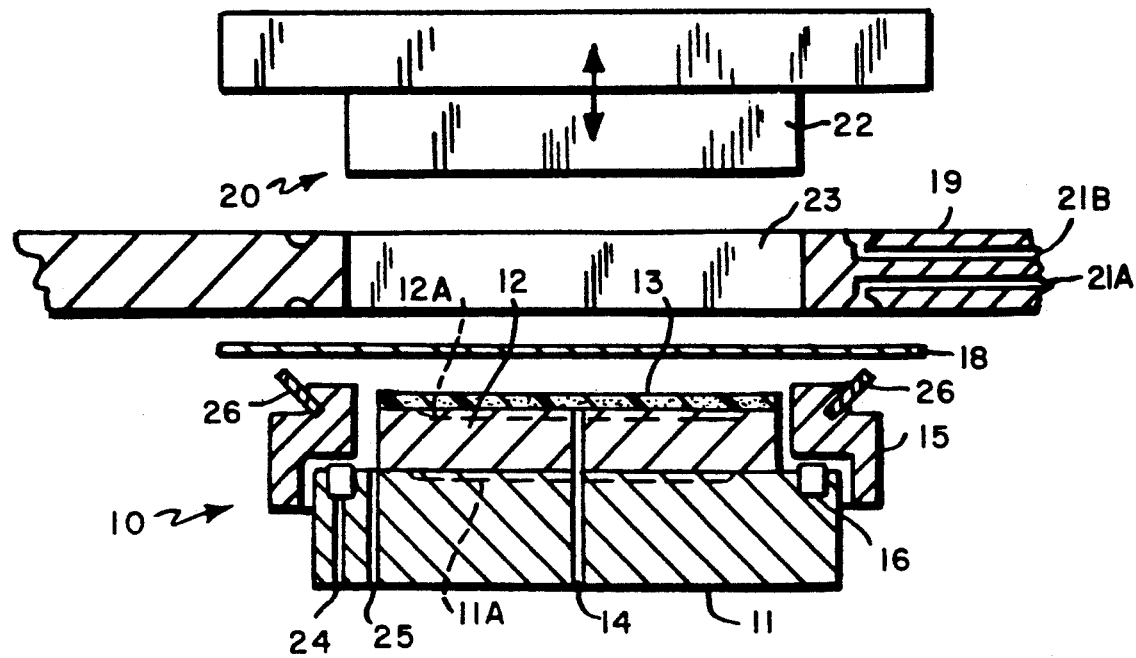

United States Patent [19]

Everett et al.

[11] Patent Number: 5,160,959
[45] Date of Patent: Nov. 3, 1992

[54] DEVICE AND METHOD FOR THE ALIGNMENT OF MASKS

[75] Inventors: Patrick N. Everett, Concord; William F. Delaney, Millville; Marsden P. Griswold, Ashland, all of Mass.

[73] Assignee: Massachusetts Institute of Technology, Cambridge, Mass.

[21] Appl. No.: 809,644

[22] Filed: Dec. 9, 1991

[51] Int. Cl.$^5$ ............................................. G03B 27/42
[52] U.S. Cl. ........................................ 355/53; 355/91; 355/78
[58] Field of Search ................. 355/53, 78, 91, 92, 355/93, 94, 95

[56] References Cited

U.S. PATENT DOCUMENTS

| | | | |
|---|---|---|---|
| 4,032,233 | 6/1977 | Oscarsson et al. | 355/91 |
| 4,089,603 | 5/1978 | Jacobs | 355/91 |
| 4,551,016 | 11/1985 | Maher et al. | 355/91 |
| 4,888,488 | 12/1989 | Miyake | 355/91 |
| 4,967,230 | 10/1990 | Meacham | 355/91 |

*Primary Examiner*—Monroe H. Hayes
*Attorney, Agent, or Firm*—Robert F. O'Connell

[57] ABSTRACT

A device for aligning a flexible mask with a substrate when the substrate is mounted on a vacuum chuck member which includes a surround member surrounding the exposed surface of the substrate. The mask is held on a mask holder and the chuck member and mask holder are movable toward and away from each other. The surround member rests on a flexible element which effectively causes the surround member to float so that when the mask is brought into contact with the substrate, the mask always lies in the same plane as the exposed surface of the substrate and the exposed surface of the surround member and no distortion of the mask occurs.

7 Claims, 1 Drawing Sheet

DEVICE AND METHOD FOR THE ALIGNMENT OF MASKS

INTRODUCTION

This invention relates generally to optical systems, such as photolithography systems, and, more particularly, to the alignment of flexible, or rigid, masks relative to a substrate for use in photolithographic processes for making integrated circuits and binary optic devices, for example.

BACKGROUND OF THE INVENTION

When fabricating integrated circuits or binary optic devices using contact photolithography techniques, the conventional process used requires the repeated alignment of masks to make contact with wafers, or substrates, in such a manner as to place the mask in registration with one or more features generated in previous steps of the process.

Such contact photolithography process can achieve submicron resolution and has lower capital costs than projection (i.e., non-contact) lithography techniques. Ultimate resolution requires near-perfect contact between the mask and a photoresist-coated substrate, on a sub-wavelength scale. Practically, this near-perfect contact is easier to achieve if either the mask or the substrate can flex and so conform to the opposite member. This flexibility helps correct for imperfect flatness of the contacting surfaces and minimizes the effect of dust particles, which can occur even in the cleanest of clean rooms.

While traditionally masks used in contact lithography are between 1.5 and 3-mm thick, for example, and are quite rigid, there are other reasons for using thinner and more flexible masks when preparing integrated circuits or binary optics devices. First, many substrates are also rigid and it is extremely difficult to assure conformity of contact between two rigid surfaces especially over areas more than a few mm. in diameter. Second, it may be preferable to use copies of the rigid master, e.g., to preserve the master from damage, and whatever the reason for copying a rigid master, it should be copied onto a flexible (i.e., a conformable) mask to preserve fidelity.

Thus, flexible masks allow intimate contact between the entire surface of the mask and the substrate, as is needed for a precise transfer of the mask features. Flexible masks which are sufficiently thin and flexible that they can be brought into precise conformity with the surface of the substrate must have the substrate surrounded by a surface which is at the same height as the surface of the substrate so that the mask does not become distorted because of surface discontinuities at the edges of the substrate. In currently used systems, the substrate is normally held from the underneath by a vacuum chuck arranged in a jig which also supports or includes the surrounding surface. Since such systems are normally designed for use with rigid masks rather than flexible masks, there is no provision for eliminating surface discontinuities at the edges of the substrate. While the surrounding surface may be machined to eliminate discontinuities for a particular substrate, normal tolerances in substrate thickness will result in discontinuities for other substrates, resulting in mask distortion if such systems are used with flexible masks. When using a flexible mask, the combination of the substrate and the surrounding surface would be brought into contact with the flexible mask, and the required vacuum could be drawn to conform the mask to the combination of surfaces. However, this operation would result in distortion of the flexible mask if the surrounding surface is not matched to the substrate.

One exemplary system available for such purpose is the Mask Aligner MA6 manufactured and sold by Karl Suss America, Inc. of Waterbury Center, Vt. Such device is designed normally for use with rigid masks and includes a substrate wedge error corrector (SWEC), as is already known to those in the art.

When attempting to use such device with a flexible mask to check alignment, and to attempt good contact during exposure, a vacuum is pulled between the flexible mask and the substrate. A mismatch in height between the substrate surface and the surrounding surface must be extremely small, e.g., less than about 0.001 inches, to prevent significant distortions in the flexible mask, when a vacuum is pulled, which distortion can result from the mask's contorting as it bridges any discontinuity between the substrate and the surrounding surface. Because the substrate in such device is supported from the back, the combination of wedge angle and thickness tolerances in typical substrates makes it very difficult to ensure that the surrounding surface has the same height as the substrate, within the required tolerance, using the device with flexible or rigid masks.

Such problem in the past has been overcome when using flexible masks by providing an assortment of differently dimensioned jigs and packing shims, each mask and substrate combination requiring a selection of one of a relatively large number of different jigs and the use of a variety of different shims in an attempt to match the substrate and surrounding surfaces appropriately. Accordingly, obtaining a precise matching of the surface heights is tedious, time-consuming, and not always successful.

For example, for a 1-inch diameter substrate having a wedge angle of 30 arc minutes and a thickness tolerance of $+/-0.005''$, the wedge effect alone produces a thickness variation of about 0.009''. Even if the substrate surface were precisely level with the surrounding surface at one side and projecting only 0.001'' off a precise level at the other side, the cocking that results would cause the substrate edge on the high side to hit and distort a flexible mask when attempting a wedge error correction operation to bring the mask and substrate surfaces parallel.

Accordingly, it is desirable to provide a system, especially useful with flexible masks, while still useful with rigid masks, which precisely aligns a substrate surface and a surrounding surface without the need to provide a variety of differently dimensioned jigs or a plurality of different packing shims.

BRIEF SUMMARY OF THE INVENTION

In accordance with the invention, the surfaces of a substrate and a surrounding surface are mechanically brought into precisely the same plane in a manner which eliminates the need to provide for precise tolerances in the substrate holder, or jig, or the need to allow for different substrate thicknesses and/or wedge angles. The surrounding surface preferably is arranged to have an outer diameter larger than the hole in the flexible mask backing plate and is "floated" with gentle pressure against the flexible mask whenever mask contact is required, such floating operation being performed independently of the substrate. Because the floating surrounding surface is larger than the hole in the mask backing plate, the flexible mask will not distort.

The substrate is held on a vacuum chuck as in the current MA6 Mask Aligner device and the SWEC technique can still be used in the known manner as before for initially orienting the substrate against the mask, with only the addition of a precisely machined plug for backing the flexible mask. During the initial raising of the substrate, it will self-level against the plug-backed mask, as in the previous device, to determine the appropriate contact height and orientation. The SWEC device then ensures that, on successive liftings of the substrate into contact with the mask (with the rigid plug support removed), the substrate will always stop at the right height and orientation. The use of a floating surrounding surface assures that such surrounding surface always comes to its optimum plane, i.e., the same plane as that of the substrate surface, since it will be pushed against the portion of the flexible mask that is supported by its backing plate. In this way, the difference in height between the substrate and the surrounding surface, attributable to tolerances in the jig and the substrate, are eliminated. Any remaining height difference will be due to imprecision in the SWEC device which, however, can be, held to less than 0.001".

On contact, a vacuum is applied between the mask and the substrate, as well as to the surrounding surface to conform the mask to the substrate. Such conforming of the mask to the substrate can be speeded up in the system of the invention by pre-applying a relatively small, or gentle, vacuum as the substrate and mask near each other. Such operation helps initiate contact at the center of the substrate in order to reduce the problem of entrapped air, i.e., the air will be squeezed to the edges more easily.

When lowering the substrate assembly from the mask, the parting operation is slowed by the time that it takes for air to replace the vacuum between the mask and substrate. Sometimes adhesion occurs between the surfaces even when the vacuum has dissipated. In accordance with the invention, the parting of the substrate and mask can be made more rapidly and more definite in nature by replacing the vacuum with a relatively gentle pressure as parting begins. Such pressure will also reduce the impact of any small leak to the vacuum chuck that holds down the substrate.

Further, the vacuum drawn between mask and substrate can also be applied through the gap between the substrate and the surrounding surface so as to allow the mask and substrate to be pulled together.

DESCRIPTION OF THE INVENTION

Figure 2:
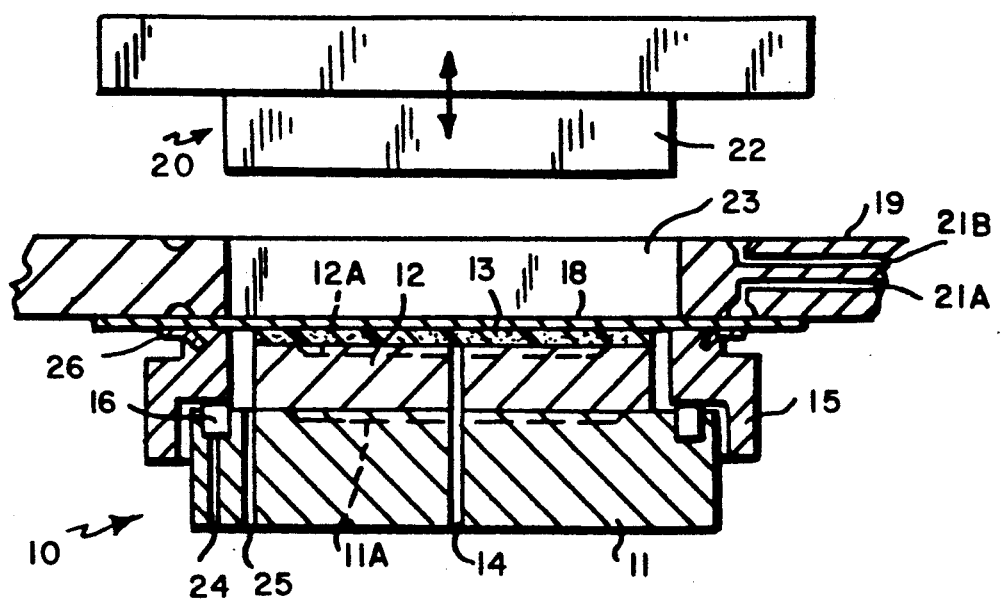

The invention can be described in more detail with the help of the accompanying drawings wherein FIG. 1 is a view in section of a preferred embodiment of the device of the invention at one stage of the operation thereof; and FIG. 2 is a view in section of the embodiment of FIG. 1 at another stage of the operation thereof.

As can be seen in FIG. 1, a standard substrate, or wafer, holder 10 includes a base 11 and a vacuum spacer 12 having a thickness selected to accommodate most substrates or wafers (as discussed further below). A substrate 13 is positioned on the upper surface of vacuum spacer 12 and a vacuum port 14 is used to draw a vacuum for retaining the substrate 13 on the surface of spacer 12 and the spacer 12 on the surface of base 11.

The vacuum port 14 in each case communicates with an array of vacuum channels distributed at the surface of spacer 12 and base 11, respectively, as indicated by dashed lines 12A and 11A, in order to assure that the substrate 13 and spacer 12 are satisfactorily retained against such respective surfaces. The edge of base 11 extends beyond the edge of spacer 12 and has a "floatable" ring 15 positioned thereon, the upper surface of which forms a surrounding surface, i.e., a surface which surrounds the upper surface of substrate 13 at its outer edge. The ring 15 is "floatable" in that it rests on a flexible member which in the embodiment shown is an inflatable tube member 16 which is retained in a recess at the periphery of base 11.

A flexible mask 18 is retained at the surface of a mask holder 19, such surface being positioned so as to be appropriately disposed opposite the upper surface of substrate 13. Mask 18 is held at the lower surface of mask holder 19 by drawing a vacuum via vacuum port 21A. A mask backing structure 20 is retained at the upper surface of mask holder 19 by drawing a vacuum via vacuum port 21B, such structure having a plug, or backing, element 22 which can be inserted into an opening 23 in mask holder 19 when the vacuum is drawn at port 21B. The thickness of the plug element 22 is the same as that of the mask holder 19, so that the flexible mask 18 is held against the substantially flat surface formed by the plug and mask holder 19. The plug element 22 provides a hard backing for the flexible mask for allowing a standard-wedge-error correcting system to work in a manner substantially as in the previously known Karl Suss of America device mentioned above.

In the process of using the mask in a photolithography process, initially, the substrate holder 10 is moved upwardly toward the mask holder 19 and self-orients itself so that the upper surface of substrate 13 is positioned against the lower surface of flexible mask 18. During this operation the plug element 22 is inserted into opening 23 as a backing for mask 18. At this initial stage, the inflatable tube member 16 is not inflated. When the substrate 13 is so initially oriented against the mask 18, the orientation is locked and the vertical position of the substrate holder is noted by the SWEC control system so that, when the substrate holder is removed downwardly from such vertical position, it can always be subsequently brought back to the same vertical position, retaining the correct orientation.

Plug element 22 is then removed from the opening 23 and the substrate holder 10 is moved downwardly slightly to move the substrate 13 from its position against mask 18 to allow horizontal aligning motions. After such aligning motions, the substrate holder 10 is moved upwardly to the same vertical position that had been previously noted. Accordingly, the substrate 13 is effectively positioned so that its upper surface is in the same horizontal plane it occupied when in such previous position.

The inflated tube member 16 is then pressurized via air pressure input port 24 so that it exerts a force on floating ring 15 so the upper surface thereof is thereupon positioned against the lower surface of flexible mask 18 at the region where the mask is backed by the mask holder 19 as shown in FIG. 2. Consequently, all points on the upper surface of the substrate 13, on the upper surface of floating ring 15, and on the lower surface of the mask 18 in contact therewith automatically are caused to lie in the same continuous plane. A vacuum is now drawn via vacuum port 25 to hold the mask against the substrate 13 and the surrounding surface of ring 15. The vacuum is entrapped by the self-sealing flexible ring 26. Because the inflatable tube member 16 assures that the surface of substrate 13 and the surrounding surface of ring 15 lie in the same plane, the flexible mask does not buckle or otherwise become distorted when the vacuum pulls it into intimate contact with the substrate surface and the surrounding surface as shown in FIG. 2. While there is a very small gap present between the outer edge of substrate 13 and the inner edge of floating ring 15, the presence of such a gap will not cause any distortion problems with the mask so long as it is sufficiently small, e.g., less than about 0.50 mm.

The use of a floating ring 15 as the surrounding surface for the substrate allows the device to be used for substrates of different thicknesses within a range which can be accommodated by the floating action of ring 15. If substrate thicknesses depart radically from such range, vacuum spacers 12 having different thicknesses to accommodate other substrate thickness ranges can be used.

In operation, when the vacuum is drawn between the mask and the substrate and its surrounding surface, the time required for conforming the mask to the substrate can be reduced if a gentle vacuum is first applied via vacuum port 25 as the mask and substrate are nearing each other prior to contact, a full vacuum being drawn once contact has been made. Such a procedure will tend to assist in initiating contact at the center of the substrate so as to reduce the problem of entrapping air between the mask and substrate. The use of a gentle vacuum prior to contact causes the air between the mask and substrate to be moved (in effect, to be squeezed) more easily to the edges of the substrate and the surrounding surface of ring 15.

When lowering the substrate holder from the mask, i.e., during the parting of the surfaces of the mask and the substrate and its surrounding surface, the parting is slowed down by the time it takes for the air to replace the vacuum between the mask and substrate surfaces. If air or inert gas at a gentle pressure is supplied via port 25 as parting starts to occur, the parting of the substrate and the mask will be speeded up and made more definite. The use of such a gentle pressure will also reduce the impact of any small vacuum leak that may occur via the vacuum port 14 which retains the substrate on the substrate holder.

It should also be pointed out that since the vacuum between the mask and the substrate is drawn by vacuum port 25 through the gap which is present between the edge of the substrate and the edge of the floating ring, the mask and substrate are pulled together very quickly.

In order to prevent leakage of the vacuum between the mask and substrate, a flexible vacuum seal element 26 in the form of a peripheral silicone rubber strip, for example, is affixed to the outer edge of the upper surface of ring 15, as shown, so that its free end contacts the surface of the mask to seal in the vacuum.

While the device above is found to be especially useful in aligning flexible masks, it can also be used to align rigid masks. Thus, the device can accommodate rigid masks using substrates of varying thicknesses, while still assuring good contact between the rigid mask surface and the surfaces of the substrate and floating ring. Accordingly, the need to use different substrate holders for different rigid masks is avoided and the substrate holder of the invention can act as an effective universal holder for both flexible and rigid masks. Thus, a particular vacuum spacer can be used for a particular range of substrate thicknesses, and when the substrate thickness lies outside such range a simple change to a different spacer can be made to accommodate a different range of substrate thicknesses.

While the above specific embodiment of the invention represents a preferred embodiment thereof, modifications thereof may occur to those in the art within the spirit and scope of the invention. Hence, the invention is not to be construed as limited to the particular embodiment disclosed herein, except as defined by the appended claims.

We claim:

1. A device for aligning a mask with a substrate, said device comprising
    first means for holding a substrate
    second means for holding a mask;
    means for moving said first and second means toward and away from each other to bring an exposed surface of said mask into contact with an exposed surface of said
    said first means including
        mounting means on which said substrate is mounted;
        surround means adjacent said mounting means for providing a surface surrounding the exposed surface of said substrate; and
        flexible means on which said surround means is flexibly mounted;
    whereby, when said moving means moves said first and second means toward each other, the exposed surface of said mask is brought into contact with, and lies in the same plane as, the exposed surface of said substrate and the exposed surrounding surface of said flexibly mounted surround means.

2. A device in accordance with claim 1 wherein said flexible means is an inflatable tube member.

3. A device in accordance with claim 2 and further including air pressure means for pressurizing said inflatable tube member to move said surround means so that its exposed surface lies in the same plane as the exposed surface of said substrate.

4. A device in accordance with claim 3 and further including mask vacuum means for bringing the exposed surface of said mask into contact with the exposed surface of said substrate and the exposed surface of said flexibly mounted surround means.

5. A device in accordance with claim 4 and further including sealing means mounted on said surround means for providing a vacuum seal when said vacuum means brings said mask into contact with said substrate and said surround means.

6. A device in accordance with claim 5 and further including substrate vacuum means for holding said substrate in its position on said mounting means.

7. A device in accordance with claim 6 wherein said surround means includes further vacuum means for holding said mask on said surround means.

* * * * *